United States Patent

Conrad

(10) Patent No.: US 9,822,799 B2
(45) Date of Patent: Nov. 21, 2017

(54) ARRANGEMENT WITH A VACUUM PUMP AND METHOD OF COMPENSATING MAGNETIC FIELD PRODUCED BY MAGNETIC INTERFERENCE FIELD OF AT LEAST ONE VACUUM PUMP COMPONENT

(71) Applicant: Pfeiffer Vacuum GmbH, Asslar (DE)

(72) Inventor: Armin Conrad, Herborn (DE)

(73) Assignee: PFEIFFER VACUUM GMBH, Asslar (DE)

( * ) Notice: Subject to any disclaimer, the term of this patent is extended or adjusted under 35 U.S.C. 154(b) by 150 days.

(21) Appl. No.: 14/481,989

(22) Filed: Sep. 10, 2014

(65) Prior Publication Data

US 2015/0078881 A1 Mar. 19, 2015

(30) Foreign Application Priority Data

Sep. 17, 2013 (DE) ........................ 10 2013 110 251

(51) Int. Cl.
| | |
|---|---|
| H02K 7/09 | (2006.01) |
| F04D 13/06 | (2006.01) |
| F04D 29/05 | (2006.01) |
| F04D 19/04 | (2006.01) |
| F04D 29/64 | (2006.01) |
| F04D 27/02 | (2006.01) |
| F04D 29/66 | (2006.01) |
| H01J 37/32 | (2006.01) |
| F04D 29/54 | (2006.01) |
| F04B 37/08 | (2006.01) |
| F04B 37/14 | (2006.01) |
| F04D 29/058 | (2006.01) |

(52) U.S. Cl.
CPC ............ *F04D 29/644* (2013.01); *F04B 37/08* (2013.01); *F04B 37/14* (2013.01); *F04D 19/04* (2013.01); *F04D 19/042* (2013.01); *F04D 27/0292* (2013.01); *F04D 29/542* (2013.01); *F04D 29/665* (2013.01); *H01J 37/32834* (2013.01); *F04D 29/058* (2013.01); *F16C 2360/45* (2013.01)

(58) Field of Classification Search
CPC ................................. F04D 19/00; H02K 7/09
USPC ............. 310/90.5, 186; 417/355, 365, 423.4, 417/423.12
See application file for complete search history.

(56) References Cited

U.S. PATENT DOCUMENTS

| | | | |
|---|---|---|---|
| 5,577,883 A | * | 11/1996 | Schutz .................... F04D 19/04 415/177 |
| 6,831,281 B2 | | 12/2004 | Nakasuji |
| 6,840,736 B2 | | 1/2005 | Ohtachi |
| 6,927,550 B2 | | 8/2005 | Tamisier |

(Continued)

FOREIGN PATENT DOCUMENTS

| | | |
|---|---|---|
| DE | 10 2010 052 660 A1 | 5/2012 |
| JP | 63-252288 | 10/1988 |

(Continued)

*Primary Examiner* — Jose Gonzalez Quinones
(74) *Attorney, Agent, or Firm* — Abelman, Frayne & Schwab

(57) ABSTRACT

An arrangement includes a vacuum pump having a rotor, and a drive unit for driving the rotor and having at least one magnetic interference field-generating component and at least one compensation coil for compensating the magnetic interference field generated by the at least one component.

18 Claims, 2 Drawing Sheets

(56) References Cited

U.S. PATENT DOCUMENTS

| | | | |
|---|---|---|---|
| 8,592,777 B2 | 11/2013 | Kropp | |
| 2002/0121615 A1* | 9/2002 | Nakasuji | B82Y 10/00 |
| | | | 250/492.22 |
| 2003/0180162 A1* | 9/2003 | Beyer | F04D 19/048 |
| | | | 417/353 |
| 2007/0164627 A1* | 7/2007 | Brunet | F16C 32/0459 |
| | | | 310/90.5 |

FOREIGN PATENT DOCUMENTS

| | | |
|---|---|---|
| JP | 11250844 U | 9/1999 |
| JP | 20003173755 A | 6/2003 |
| JP | 2004158612 | 6/2004 |
| JP | 2004171846 | 6/2004 |
| JP | 3119272 U | 1/2006 |
| JP | 2006209980 | 8/2006 |

* cited by examiner

ARRANGEMENT WITH A VACUUM PUMP AND METHOD OF COMPENSATING MAGNETIC FIELD PRODUCED BY MAGNETIC INTERFERENCE FIELD OF AT LEAST ONE VACUUM PUMP COMPONENT

BACKGROUND OF THE INVENTION

1. Field of the Invention

The present invention relates to an arrangement with a vacuum pump and a method of compensating a magnetic field produced by at least one vacuum pump component, e.g., a magnetic bearing and/or motor.

2. Description of the Prior Art

Since long ago turbomolecular pumps are used in vacuum technology for producing high and ultra-high vacuum. There, the vacuum production is based on a rotor having a plurality of blades offset relative to each other along the rotor axis and between which stator blades are arranged.

Usually, rotors are rotatably supported, in particular, in the turbomolecular pumps by at least one radially arranged magnetic bearing. Often, these magnetic bearings are supported axially by a second bearing, e.g., a ball bearing that insures an axial and radial stabilization.

Such a turbomolecular pump is disclosed, e.g., in DE 10 2010 052 660 A1.

A magnetic bearing usually is formed of several rings having a coil-shaped construction. The homogeneity of the rings is determined before their mounting in the turbomolecular pump and, according to practice, the rings are so tuned with respect to each other that inhomogeneity of separate rings is eliminated to a most possible extent.

However, often, a complete elimination of the inhomogeneity is not possible so that a resulting magnetic field is generated during operation of the turbomolecular pump.

In many applications which are known from practice, such magnetic fields do not cause any trouble because often they are relatively small.

However, when turbomolecular pumps are used in high sensitive apparatuses, e.g., for evacuation of test chambers of an electronic microscope, the magnetic interference field, which is generated, e.g., by magnetic bearings or a motor, can lead to a so-called dispersion, i.e., a certain unsharpness.

The object of the invention is to provide a turbomolecular pump in which a possible magnetic interference field of at least one component, e.g., a magnetic bearing and/or a motor is compensated, as well as a method of compensating a magnetic interference field of at least one component arranged in the turbomolecular pump, e.g., of magnetic bearing and/or motor, and which can be simply and economically implemented.

SUMMARY OF THE INVENTION

This object of the invention is achieved by providing an arrangement with a vacuum pump having a rotor and a motor for driving the rotor, and which is characterized in that there is provided at least one compensation coil for compensating the magnetic interference field generated by at least one component of the vacuum pump.

A magnetic bearing that rotatably supports the rotor can form the magnetic interference field-producing component, for example. The magnetic interference can also be generated by the motor that drives the rotor. However, the use of the invention is not limited to these components.

Advantageously, at least one compensation coil generates a field vector ($\vec{B}_K$) with adjustable amplitude and direction. By providing at least one additional coil, a field vector $\vec{B}_K$ with adjustable amplitude and direction is generated in the coil by current that flows therethrough. The generated field vector compensates the magnetic interference field of the at least one component of the vacuum pump.

Advantageously, it is provided that the compensation device is formed as a compensation device that derives the rotation-synchronous compensation principal frequency and first to n harmonic component with $n \geq 2$ from the drive electronics of the turbomolecular pump.

According to an advantageous embodiment of the invention, there are provided three compensation coils for compensating the magnetic interference field generated by the at least one component of the drive means of the vacuum pump.

With three coils, it is possible, at corresponding arrangement of the coils, to provide compensation in each spatial direction (X, Y, Z) because the field vector of the magnetic interference field is a directional vector.

The coils are advantageously so arranged relative to each other that the magnetic fields of the coils are not parallel to each other, i.e., the magnetic fields of the three coils are oriented advantageously in three spatial directions relative to each other. According to a particular advantageous embodiment of the invention, the three compensation coils are oriented at an angle of 90° to each other. Advantageously, one of the coils has its coil plane extending transverse to the rotor axis, and the two other coils are arranged transverse to the first coil and to each other, i.e., the second coil advantageously arranged parallel to the rotor axis, and the third coil is arranged at an angle of 90° to the both coils.

It can be sufficient to compensate the magnetic interference field only in one plane. However, better results are achieved when the magnetic interference field is compensated completely, i.e., each spatial direction X, Y, Z is associated with at least one compensation coil so that the magnetic interference field can be compensated in three directions, i.e., in all of the three spatial directions X, Y, Z.

It is possible to associate each spatial direction X, Y, Z or at least one spatial direction X, Y, or Z with a separate compensation coil. Each separate coil can be associated with another coil, preferably provided on the same axis. In this case, a pair of compensation coils is provided. In one embodiment of the invention, each spatial direction is associated with at least one pair of compensation coils, so that the magnetic interference field can be compensated in all of the spatial directions X, Y, Z.

A pair of compensation coils can be so adjoined and/or controlled that only one separate coil of the compensation coil pair is supplied with current.

According to a further advantageous embodiment of the invention, at least one compensation coil is formed of at least one winding of an electrical conductor. This is the simplest way to form a compensation coil.

According to another embodiment of the invention, there is provided at least one sensor for at least one of sizing and measuring the magnetic interference field of the at least one component. With the magnetic interference field being sized, the at least one compensation coil can be so controlled that the magnetic interference field is compensated to a most possible extent or completely.

According to yet another embodiment of the invention, in addition to a compensation coil for generating a magnetic field, there is provided a current source for the at least one compensation coil. In addition, it makes sense to provide a compensation device for controlling current in the at least one compensation coil dependent on the sizing and/or measuring the magnetic interference field of the at least one component.

With the at least one coil, advantageously, a field vector $\vec{B}$ with adjustable amplitude and orientation is produced to generate a corresponding compensation field.

Generally, so many harmonic components are derived as necessary for a meaningful compensation.

The compensation electronics can derive the rotation—synchronous compensation principal frequency via an induction coil. The amplitude and phase variation of the current in at least one coil permits to minimize the resulting field which, in turn, permits to minimize path deviations and loads, e.g., in an electronic microscope.

The amplitude and phase variation of the current in coils is carried out according to the following equation:

$$i_z = i_{zo} \cdot \sin(\omega_o \cdot t + \phi_o) + i_{z1} \cdot \sin(2\omega_o \cdot t + \phi_1) + i_{z2} \cdot \sin(3\omega_o \cdot t + \phi_2) + \ldots$$

This equation applies to Z-direction, and is the same for X- and Y-directions.

The zero or minimal tuning is carried out either automatically or by a purposeful variation of the above-mentioned parameters and detection of the resulting magnetic interference field with a magnetic field sensor or by observation of dispersion in the end apparatus, e.g., electronic microscope.

Advantageously, a sensor for determining the phase reference is provided.

The field compensation should so be carried out that it is phase-shifted with respect to the interference signal of the magnetic field by 180°.

As discussed previously, the magnetic interference field-producing component is formed, e.g., as a magnetic bearing or an electric motor. The magnetic bearing can be formed as a permanent magnetic bearing or an active magnetic bearing. However, it is also possible to compensate magnetic fields produced by other components of a vacuum pump.

According to a further advantageous embodiment, the at least one compensation coil is arranged in or on the vacuum pump. This insures a compact construction of the inventive arrangement.

According to another advantageous embodiment, the vacuum pump is formed as turbomolecular pump, roots pump, rotary vane pump, or as peripheral pump.

Those are common types of pumps. Here, the compensation of the magnetic interference fields is particular advantageous.

Turbomolecular pumps have a construction in which a multi-stage turbine-like rotor with blade disc rotates in the pump housing. Between the rotor disc, stator blade discs with the same geometry are arranged in a mirror-inverted manner.

The rotors are supported each with two bearings, e.g., two ball bearings. Because of the lubrication film, in this case, both bearing are arranged on the forevacuum side.

There exists a possibility to provide a hybrid bearing support, i.e., to use two bearing concepts in a single pump An oil-lubricated bearing is arranged, e.g., on a shaft end at the forevacuum side and on the high-vacuum side, a maintenance- and wear-free permanent magnetic bearing that centers the rotor radially, is arranged.

For driving the rotor, advantageously, a brushless d.c. motor is used that, together with an electronic drive unit, provides for a rotational frequency up to 1,500 Hz (90,000) revolutions/min. Thereby, the necessary, for pumping the gas, blade speed is achieved.

In roots pumps, two synchronously rotatable in opposite directions, rotors rotate in a housing in a contactless manner. The rotors have an "8"-shape and are separated from each other and from the stator by a narrow gap. By its action, it corresponds to a gear pump with two gears that deliver gas from a suction opening to an outlet opening. A shaft that carries the first piston is driven by a motor. The synchronization of the other shaft that carries the second piston, is carried out with a gear pair in the gear compartment.

As there is not friction in the compression chamber, the roots pump can be driven with a high speed, e.g., 1,500-3,000 revolutions/min.

Rotary vane pumps are oil-superimposed rotary displacement pumps. The pump system consists of a housing, an eccentric rotor, slides movable radially by centrifugal and spring forces, inlet, and outlet. An inlet valve is provided as a vacuum safety valve and is always open during operation. Inside the housing, there is a working chamber limited by a stator, a rotor, and the slides. The eccentric rotor and the slides divide the working chamber in two separate chambers with variable volumes. When the rotor rotates, gas flows into the increased compression chamber until it is closed by the second slide. Finally, the enclosed gas is compressed until the outlet valve opens against the atmospheric pressure. The outlet valve is oil-superimposed. When the outlet valve opens, a small amount of oil leaks into the compression chamber and effects lubrication and sealing of the slide against the housing (the stator).

Peripheral pumps are vacuum pumps that can operate from atmospheric pressure and to high vacuum region. The pumping system of a peripheral pump consists of a rotor disc with blades provided on its outer circumference and an annular working chamber, peripheral channel. The channel at one point narrows to a disc profile by a breaker. The pumping action is produced by a helically shaped flow from the inlet to the outlet caused by the blade of the rotating rotor. Thereby, a pressure difference is produced between the inlet and the outlet. Low end pressures are achieved with several, consecutively arranged one beneath the other, pump stages.

The inventive method of compensating a magnetic interference field generated by at least one component arranged in a vacuum pump, is characterized in that at least one compensation coil compensates the magnetic interference field of the at least one component of the vacuum pump.

The component can be, e.g., a drive motor and/or at least one magnetic bearing for supporting the rotor.

The advantage of the inventive method consists in that a magnetic field generated by at least one compensation coil compensates the magnetic interferences fields of components of the vacuum pump.

According to a particular advantageous embodiment of the invention, there are provided three coils for compensating the magnetic interference field of at least one component. With arrangement of three coils, it is possible to carry out compensation in each spatial direction X, Y, Z.

Advantageously, there is provided at least one sensor that sizes or measures the magnetic interference field. By sizing and measuring the magnetic interference field, at least one coil can be so adjusted that an optimal compensation of the magnetic interference field takes place.

A further advantageous embodiment of the invention contemplates that to compensation device controls and/or regulates current in the at least one coil dependent on the sized or measured magnetic interference field. The advantage of this embodiment consists in that the compensation device carries out all of the control and regulation processes. The compensation device receives data of the magnetic interference field acquired by the at least one sensor, and it can so control the at least one coil, i.e., the current in the at least one coil, that an optimal compensation is achieved.

According to a yet further advantageous embodiment, the at least one compensation coil generates a field vector $\vec{B}$ with adjustable amplitude and direction in order to optimally compensate the magnetic interference field.

According to another advantageous embodiment of the invention, the compensation device derives a rotationally-synchronous compensation principal frequency and first to a n harmonic components with n≥2 from drive electronics of the vacuum pump. With amplitude and phase variation of the current in the coil, the resulting field $\vec{B}_{res}$ is minimized. The field $\vec{B}_{res}$ is produced from the magnetic interference field $\vec{B}_{st}$ and the magnetic field $\vec{B}_K(i_{X,Y,Z})$ generated by the compensation coil as follows:

$$\vec{B}_{Res} = \vec{B}_{St} - \vec{B}_K(i_{X,Y,Z}).$$

The amplitude and phase variation of the current is carried out according to the following equation:

$$i_z = i_{zo} \cdot \sin(\omega_o \cdot t + \phi_o) \cdot i_{z1} \cdot \sin(2\omega_o \cdot t + \phi_1) + i_{z2} \cdot \sin(3\omega_o \cdot t + \phi_2) + \ldots$$

which is the same in X- and Y-directions.

According to yet another embodiment of the invention, the phase reference of the vacuum pump is acquired by a sensor.

It is also possible to acquire the phase reference without a sensor, with discernable rotor position and rotor phase, by evaluation of the commutation information with the help of a motor model and communicating the phase reference to the compensation device.

The interference signal should coincide in phase with rotation of the rotor. To this end, the phase reference should be known. The compensation of the magnetic field should be so carried out that is phase-shifted by 180° with respect to the interference signal of the magnetic field.

The inventive method permits to compensate the magnetic interference field of at least one magnetic bearing or at least one electric motor. The magnetic bearing can be formed as permanent magnetic bearing or active magnetic bearing.

According to still another embodiment of the invention, the inventive method compensates the magnetic interference field with at least one compensation coil arranged in or on the vacuum pump. Thereby a compact structure of the vacuum pump is achieved.

The present method can be particularly advantageously used in turbomolecular pumps, roots pumps, displacement pumps, or peripheral pumps. It is also possible to use it with other types of pumps.

The novel features of the present invention, which are considered as characteristic for the invention, are set forth in the appended claims. The invention itself, however, both as to its construction and its mode of operation, together with additional advantages and objects thereof, will be best understood from the following detailed description of preferred embodiment, when read with reference to the accompanying drawings.

BRIEF DESCRIPTION OF THE DRAWINGS

The drawings show.

DETAILED DESCRIPTION OF THE PREFERRED EMBODIMENT

Figure 1:
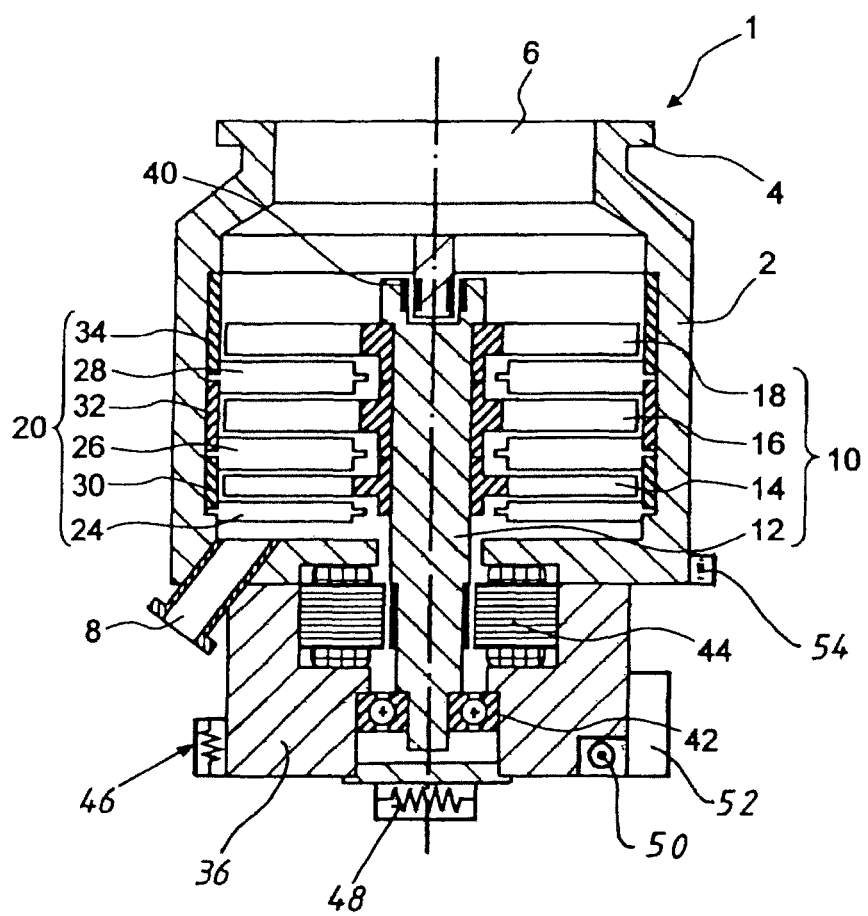
FIG. 1 a longitudinal cross-sectional view of a turbomolecular pump.

FIG. 1 shows a cross-sectional view of a turbomolecular pump 1 having a flange 4 releasably securable to a flange of a to-be-discharged chamber (not shown). The gas is aspirated through a suction opening 6 into the pump 1 and is discharged through an outlet 8. A rotor 10 and a stator 20 are located in a housing 2 of the pump. The cooperation of the rotor and stator provides for gas delivery. The rotor 10 includes a shaft 12 on which a forevacuum side rotor disc 14, an intermediate rotor disc 16, and a high vacuum side rotor disc 18 are provided. Each of the rotor discs 14, 16, 18 has several blade assemblies formed of separate blades.

The shaft 12 is rotatably supported, at its high vacuum side, by a permanent magnetic bearing 40 and at its forevacuum side, by a roller bearing 42. A drive 44 rapidly rotates the rotor with a speed of 10,000 revolutions per minute. The stator has a forevacuum side stator disc 24, an intermediate stator disc 26, and a high vacuum side stator disc 28. The stator discs 24, 26, 28 are axially spaced from each other with respect to the shaft 12 by spacer rings 30, 32, 34 and are alternatively arranged with the rotor discs 14, 16, 18. The stator discs 24, 26, 28 likewise each is provided with blade assemblies. The number of the rotor and stator discs depends on desired vacuum-technical parameters such as suction capacity, pressure ratio between the suction opening and the outlet.

On a pump attachment 36, three coils 46, 48, 50 are located. The coils 46, 48, 50 are arranged at a 90° degree angle with respect to each other. In addition, a compensation device 52 controls, via conductors, not shown, the current in the coils 46, 48, 50. A sensor 54 determines the magnetic interference field $\vec{B}_{St}$. The coils 46, 48, 50 generate a compensation field $\vec{B}_K$ so that a resulting field $\vec{B}_{Res} = \vec{B}_{St} - \vec{B}_K(i_{X,Y,Z})$ is produced. The resulting field is minimized by the compensation device 52 so that the magnetic field $\vec{B}_{St}$ generated by the magnetic bearing 40 and/or the motor 44 does not influence any other apparatus such s, e.g., an electronic microscope, with which the vacuum pump is connected.

The compensation device 52 minimizes, by varying amplitudes and phases of the current in the coils 46, 48, 50, the resulting field $\vec{B}_{Res}$, while the drive electronic produces, via an induction coil, the rotation-synchronous compensation principal frequency and first to n harmonic component with n≥2.

The amplitude and phase variation of the current in the coils 46, 48, 50 is carried out according to the following equation:

$$i_z = i_{zo} \cdot \sin(\omega_o \cdot t + \phi_o) + i_{z1} \cdot \sin(2\omega_o \cdot t + \phi_1) + i_{z2} \cdot \sin(3\omega_o \cdot t + \phi_2) + \ldots$$

which is the same in X- and Y-directions.

The field vector $\vec{B}_K$ with adjustable amplitude and direction is generated by the current in the coils 46, 48, 50. The field vector $\vec{B}_K$ compensates the magnetic interference field $\vec{B}_{St}$ which is generated by the magnetic bearing 40 and the drive motor 44 of the turbomolecular pump. The a.c. interference field naturally has the same frequency as the turbomolecular pump 1 and is slightly non-sinusoidal.

The zero or minimal tuning of the interference field is carried out either automatically by a specific variation of the above-mentioned parameters and detection of the magnetic interference field $\vec{B}_{Res}$ with the magnetic sensor 54. The tuning can also be carried out by monitoring the dispersal degree of the apparatus with which the turbomolecular pump is connected. The tuning can also be carried out in an electronic microscope (note shown).

Figure 2:
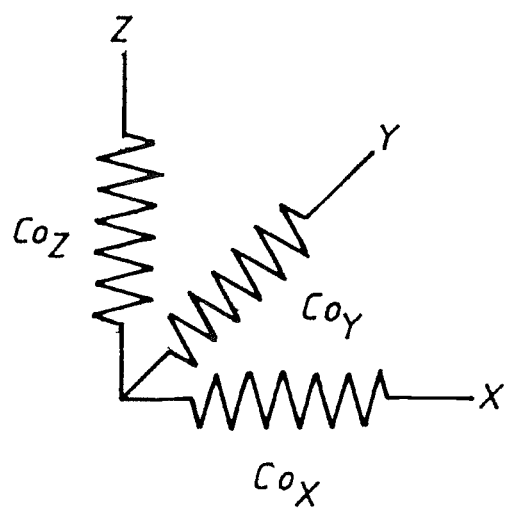
FIG. 2 a schematic view of orientation of compensation coils.

FIG. 2 shows an advantageous orientation of the coils 46, 48, 50 with respect to each other. The coil windings are oriented along X-, Y- and Z-axes so that the coils are arranged to each other at an angle of 90°.

Thereby, an optimal compensation of the magnetic interference field becomes possible.

Though the present invention was shown and described with references to the preferred embodiment, such is merely illustrative of the present invention and is not to be construed as a limitation thereof and various modifications of the present invention will be apparent to those skilled in the art. It is, therefore, not intended that the present invention be limited to the disclosed embodiment or details thereof, and the present invention includes all variations and/or alternative embodiments within the spirit and scope of the present invention as defined by the appended claims.

What is claimed is:

1. An arrangement, comprising a vacuum pump including a rotor, and drive means for driving the rotor, at least one magnetic interference field-generating component; and at least one compensation coil for compensating a magnetic interference field generated by at least one component of the vacuum pump and arranged on a vacuum pump housing or in a vacuum pump housing remotely from the at least one magnetic interference field-generating component.

2. An arrangement according to claim 1, comprising altogether three compensation coils for compensating the magnetic interference field generated by the at least one component of the vacuum pump.

3. An arrangement according to claim 2, wherein magnetic fields of the three compensation coils are oriented in three spatial directions.

4. An arrangement according to claim 3, wherein the magnetic fields of the three compensation coils are oriented at an angle of 90° to each other.

5. An arrangement according to claim 1, wherein the at least one compensation coil is formed of at least one winding of an electrical conductor.

6. An arrangement according to claim 1, further comprising at least one sensor for at least one sizing and measuring the magnetic interference field or phase reference of the at least one component.

7. An arrangement according to claim 6, further comprising a current source for the at least one compensation coil; and a compensation device for controlling current in the at least one compensation coil dependent on the at least one of sizing and measuring the magnetic interference field of the at least one component.

8. An arrangement according to claim 7, wherein the compensation device and the at least one compensation coil are formed as separately controlled components.

9. An arrangement according to claim 1, wherein the drive means comprises an electric motor for rotating the rotor, and at least one magnetic bearing for supporting the rotor, and wherein the at least one magnetic interference field generating component is one of the magnetic bearing and the electric motor.

10. An arrangement according to claim 9, wherein the magnetic bearing is formed as one of permanent magnetic bearing and active magnetic bearing.

11. An arrangement according to claim 1, wherein the vacuum pump housing has an attachment, and wherein the at least one compensation coil is arranged on or in the attachment.

12. An arrangement according to claim 1, wherein the vacuum pump includes a plurality of magnetic interference field-generating components, and the at least one compensation coil is adapted to compensate magnetic interference fields generated by the plurality of the magnetic interference field-generating components.

13. A method of compensating a magnetic interference field generated by at least one component arranged in a vacuum pump, comprising the step of providing at least one compensation coil for compensating a magnetic interference field of the at least one component of the vacuum pump, and arranging the compensation coil on a vacuum pump housing or in the vacuum pump housing remotely from the at least one magnetic interference field-generating component.

14. A method according to claim 13, comprising the step of providing a compensation device for controlling current in the at least one compensation coil dependent on one of sizing and measuring the magnetic interference field.

15. A method according to claim 13, wherein the at least one compensation coil generates a field vector having adjustable amplitude and direction.

16. A method according to claim 14, wherein the compensation device derives a rotationally-synchronous compensation principal frequency and first to n harmonic components with n≥2 from drive electronics of the vacuum pump.

17. A method according to claim 13, comprising the step of providing a sensor for determining the phase reference of the vacuum pump.

18. A method according to claim 13, wherein the at least one component is formed as one of at least one magnetic bearing and at least one electric motor.

* * * * *